US007893635B2

(12) United States Patent
Hood, III et al.

(10) Patent No.: US 7,893,635 B2
(45) Date of Patent: Feb. 22, 2011

(54) LIQUID COOLING SYSTEM WITH AUTOMATIC PUMP SPEED CONTROL

(75) Inventors: Charles D. Hood, III, Cedar Park, TX (US); Philip Grossman, Salado, TX (US)

(73) Assignee: Dell Products, LP, Round Rock, TX (US)

( * ) Notice: Subject to any disclaimer, the term of this patent is extended or adjusted under 35 U.S.C. 154(b) by 464 days.

(21) Appl. No.: 12/117,409

(22) Filed: May 8, 2008

(65) Prior Publication Data

US 2009/0277617 A1    Nov. 12, 2009

(51) Int. Cl.
*H02P 5/46* (2006.01)
(52) U.S. Cl. .......................................... 318/77; 318/68
(58) Field of Classification Search .................. 318/41, 318/49, 51, 53, 59, 66, 67, 68, 77
See application file for complete search history.

(56) References Cited

U.S. PATENT DOCUMENTS

| 1,071,999 | A |   | 7/1913  | Gilson               |
|-----------|---|---|---------|----------------------|
| 3,736,796 | A | * | 6/1973  | Hohenberg ... 73/178 T |
| 4,546,408 | A |   | 10/1985 | Rodseth et al.       |
| 5,062,276 | A | * | 11/1991 | Dudley ....... 62/176.6 |
| 5,754,412 | A |   | 5/1998  | Clavin               |
| 5,987,893 | A |   | 11/1999 | Schulz-Harder et al. |
| 6,038,128 | A |   | 3/2000  | Hood, III et al.     |
| 6,058,009 | A |   | 5/2000  | Hood, III et al.     |
| 6,125,035 | A |   | 9/2000  | Hood, III et al.     |
| 6,226,178 | B1|   | 5/2001  | Broder et al.        |
| 6,341,490 | B1|   | 1/2002  | Jones                |
| 6,450,275 | B1| * | 9/2002  | Gabriel et al. ... 180/65.23 |
| 6,471,310 | B2|   | 10/2002 | Montagna             |
| 6,543,098 | B2|   | 4/2003  | Meyer et al.         |
| 6,549,410 | B1|   | 4/2003  | Cohen                |
| 6,725,682 | B2|   | 4/2004  | Scott                |
| 6,726,505 | B2|   | 4/2004  | Cermak et al.        |
| 6,837,063 | B1|   | 1/2005  | Hood, III et al.     |
| 6,845,622 | B2|   | 1/2005  | Sauciuc et al.       |

(Continued)

FOREIGN PATENT DOCUMENTS

EP    1 684 031 A2    7/2006

(Continued)

OTHER PUBLICATIONS

"H2Ceramic Cooling: a Two-Stage Liquid/TEC Hybrid Cooling System for Over-Clocked CPUs," Wayne Caswell et al., Dell, Inc. White Paper, Oct. 2006.

(Continued)

*Primary Examiner*—Bentsu Ro
(74) *Attorney, Agent, or Firm*—Larson Newman & Abel, LLP

(57) ABSTRACT

A system comprising a fan tachometer module, a conversion module, and a pump tachometer module. The fan tachometer module is adapted to measure a speed of a cooling fan. The conversion module is in communication with the fan tachometer module, and is adapted to convert the speed of the cooling fan to a control voltage based on a predetermined ratio between the speed of the cooling fan and a speed of a cooling pump. The pump tachometer module is in communication with the conversion module, and is adapted to control the speed of the cooling pump based on the control voltage.

19 Claims, 4 Drawing Sheets

U.S. PATENT DOCUMENTS

| | | | |
|---|---|---|---|
| 6,917,522 B1 | 7/2005 | Erturk et al. | |
| 6,956,740 B2 | 10/2005 | Shimura et al. | |
| 6,971,243 B2 | 12/2005 | Scott | |
| 7,034,223 B2 | 4/2006 | Fan et al. | |
| 7,042,727 B2 | 5/2006 | Ulen et al. | |
| 7,227,761 B2 | 6/2007 | Estes et al. | |
| 7,638,961 B2 * | 12/2009 | Hoshiba | 318/430 |
| 2003/0175091 A1 | 9/2003 | Aukzemas et al. | |
| 2003/0188538 A1 | 10/2003 | Chu et al. | |
| 2005/0068737 A1 | 3/2005 | Leija et al. | |
| 2005/0122690 A1 | 6/2005 | Hood, III et al. | |
| 2005/0146850 A1 | 7/2005 | Meir | |
| 2006/0005948 A1 | 1/2006 | Sauciuc et al. | |
| 2006/0082971 A1 | 4/2006 | Artman et al. | |
| 2006/0096737 A1 | 5/2006 | Kimura | |
| 2006/0166030 A1 | 7/2006 | Suzuki et al. | |
| 2008/0100521 A1 | 5/2008 | Herbert et al. | |

FOREIGN PATENT DOCUMENTS

GB  2 322 732 A1  2/1998

OTHER PUBLICATIONS

"Overclocking," Wayne Caswell, Dell, Inc. White Paper, Oct. 2006.

* cited by examiner

LIQUID COOLING SYSTEM WITH AUTOMATIC PUMP SPEED CONTROL

FIELD OF THE DISCLOSURE

This disclosure generally relates to information handling systems, and more particularly relates to liquid cooling of information handling systems.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems include processors, which produce heat. In information handling systems such as desktop computers, the heat produced by the processors is typically managed with air cooling. However, air cooling has inherent limitations that may be exceeded by microprocessors that are increasingly dense and powerful. Liquid cooling has therefore been proposed for personal computers, such as in U.S. application Ser. No. 11/848,048 filed on Aug. 30, 2007, the disclosure of which is hereby incorporated by reference.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Figure 1:
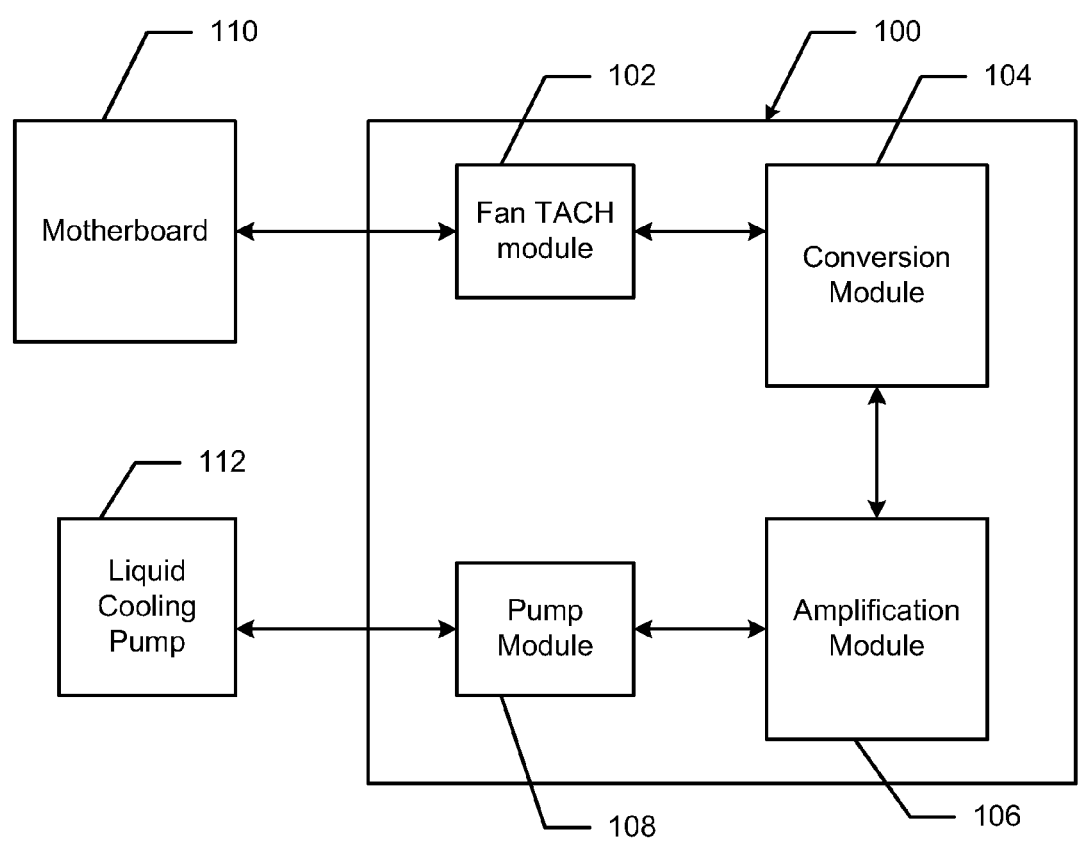
FIG. 1 is a block diagram of a liquid cooling system for an information handling system.

FIG. 1 shows a converter device 100 for a liquid cooling system of an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The converter device 100 includes a cooling fan tachometer module 102, a conversion module 104, an amplification module 106, and a cooling pump module 108. The cooling fan tachometer module 102 is in communication with a motherboard 110 and with the conversion module 104. The conversion module 104 is in communication with the amplification module 106. The cooling pump module 108 is in communication with the amplification module 106 and with a liquid cooling pump 112.

The cooling fan tachometer module 102 can receive a control signal from the motherboard 110 and can determine a tachometer frequency of a cooling fan. The control signal can be a pulse width modulated (PWM) signal or any other signal that can control the speed of the cooling fan. The conversion module 104 can convert the cooling fan frequency, received from the fan tachometer module 102, into a control voltage to be sent to the liquid cooling pump 112. The amplification module 106 can amplify the control voltage, received from the conversion module 104, to a predetermined level for use by the liquid cooling pump 112. The cooling pump module 108 receives the amplified control voltage from the amplification module 106, and then sends the control voltage to the liquid cooling pump 112.

The liquid cooling pump 112 can provide cooling in addition to the cooling fan for the information handling system. With the liquid cooling pump 112 providing additional cooling, the cooling fan can run at lower speeds and the noise produced by the cooling fan can be reduced. However, the liquid cooling pump 112 also produces noise, so the speed of the liquid cooling pump is preferably maintained at a level that produces less noise than the cooling fan. The converter device 100 can actively increase and decrease the speed of the cooling pump to keep the noise produced by the liquid cooling pump 112 below the noise produced by the cooling fan, while increasing the overall cooling capacity of the system.

As the motherboard 110 increases or decreases the speed of the cooling fan, the noise of the cooling fan also increases or decreases. Thus, the speed of the liquid cooling pump 112 is preferably adjusted accordingly to provide the maximum amount of cooling while keeping the overall noise produced by the cooling system to a minimum. The fan tachometer module 102 can continually measure the frequency of the cooling fan and send the frequency to the conversion module 104. Based on a desired ratio between the speed of the cooling fan and the speed of the liquid cooling pump 112, the conversion module 104 and the amplification module 106 can output the control voltage for the liquid cooling pump 112. The ratio between the speed of the cooling fan and the speed of the liquid cooling pump 112 can be determined such that the noise of the liquid cooling pump is below the noise of the cooling fan.

In an exemplary embodiment, the speed of the cooling fan can range from 800 rotations-per-minute (RPM) to 4000 RPM, and the speed of the liquid cooling pump 112 can range from 1200 to 3600 RPM. In this example, if the fan speed is 800 RPM then the speed of the liquid cooling pump 112 should be below 1800 RPM so that the noise level produced by the liquid cooling pump is less than that produced by the cooling fan. Thus, the converter device 100 converts the frequency of the cooling fan for 800 RPM to a control voltage that will result in the liquid cooling pump 112 having a speed of 1800 RPM.

Figure 2:
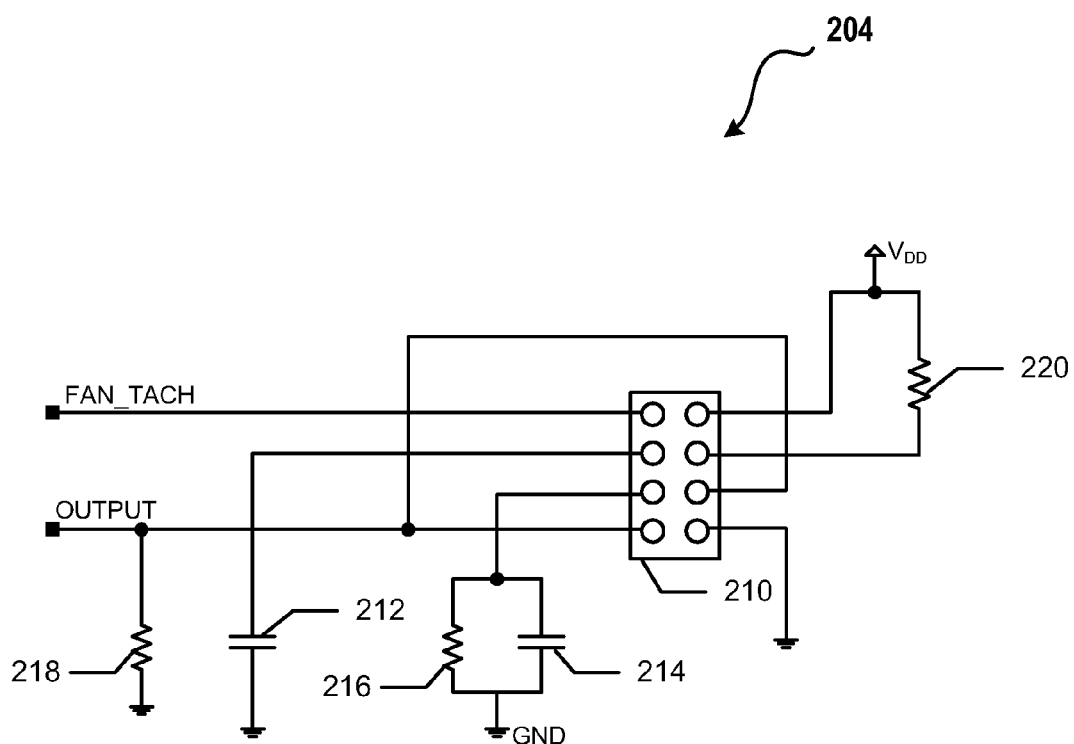
FIG. 2 is a schematic diagram of a particular embodiment of a converter circuit for the liquid cooling system of FIG. 1.

FIG. 2 is a schematic diagram of a particular embodiment of a converter circuit 204 including an integrated circuit chip 210, capacitors 212 and 214, and resistors 216, 218, and 220. The integrated circuit chip 210 includes a first terminal connected to a cooling fan tachometer signal, second and third terminals, and a fourth terminal connected to an output. The integrated circuit chip 210 also includes a fifth terminal connected to a first voltage reference, labeled $V_{DD}$, a sixth terminal, a seventh terminal connected to the fourth terminal, and an eighth terminal connected to a second voltage reference, labeled GND.

The capacitor 212 includes a first terminal connected to the second terminal of the integrated circuit chip 210, and a second terminal connected to the second voltage reference. The capacitor 214 includes a first terminal connected to the third terminal of the integrated circuit chip 210, and a second terminal connected to the second voltage reference. The resistor 216 includes a first terminal connected to the first terminal of the capacitor 214, and a second terminal connected to the second terminal of the capacitor 214. The resistor 218 includes a first terminal connected to the fourth terminal of the integrated circuit chip 210, and a second terminal connected to the second voltage reference. The resistor 220 includes a first terminal connected to the first voltage reference, and a second terminal connected to the sixth terminal of the integrated circuit chip 210.

The integrated circuit chip 210 receives a signal representing the frequency of the cooling fan at the first terminal. The integrated circuit chip 210 can be any type of chip that is designed to convert frequency to voltage. If the different resistive values of the resistors 216, 218, and 220 and the different capacitive values of the capacitors 212 and 214 are changed, then the voltage outputted from the converter module 204 is also changed. The integrated circuit chip 210 outputs a current from the fourth terminal, and the voltage created by the resistive value of the resistor 218 provides an output voltage to the amplification module 106.

Figure 3:
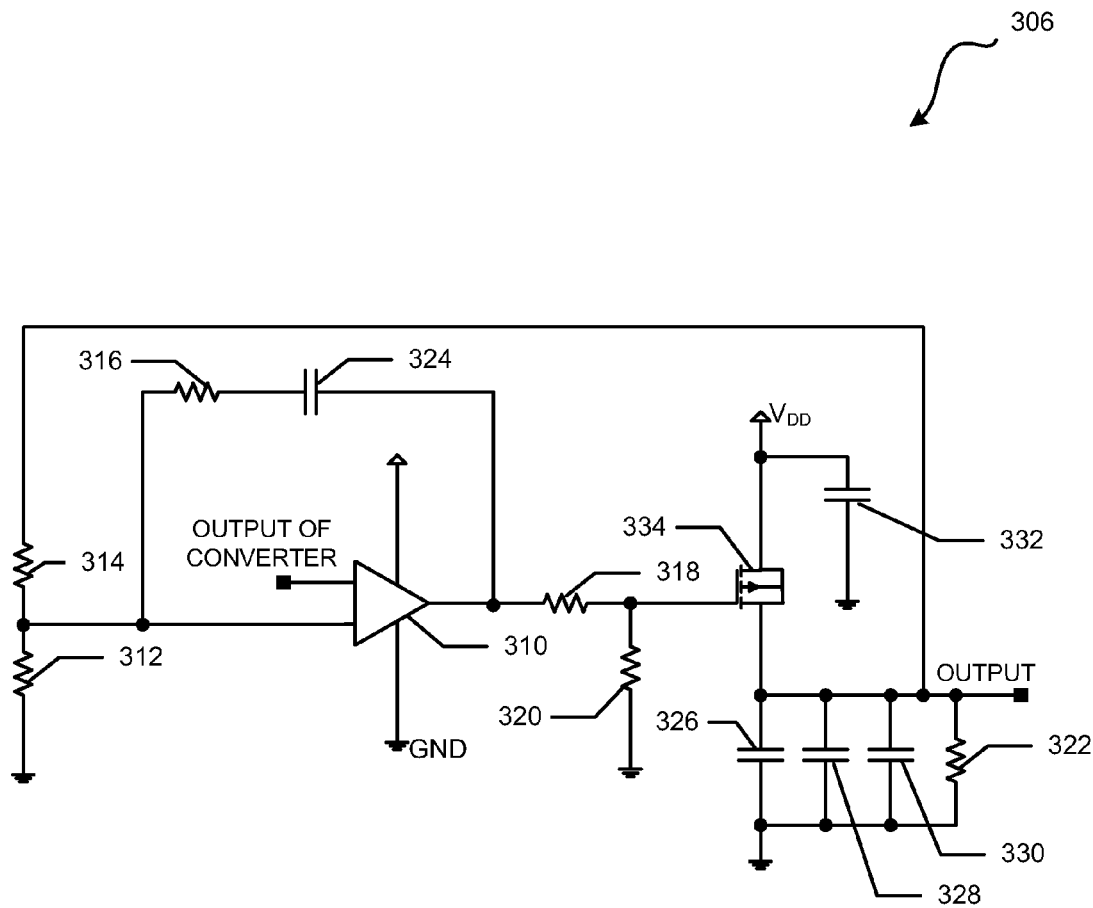
FIG. 3 is a schematic diagram of a particular embodiment of an amplification circuit for the liquid cooling system of FIG. 1.

FIG. 3 is a schematic diagram of a particular embodiment of an amplification circuit 306 including an operational amplifier 310, resistors 312, 314, 316, 318, 320, and 322, capacitors 324, 326, 328, 330, and 332, and a transistor 334. The operational amplifier 310 includes a first input terminal connected to the output of the converter module 104, a second input terminal, an output terminal, a first power terminal connected to a first voltage reference, labeled $V_{DD}$, and a second power terminal connected to a second voltage reference, labeled GND. The resistor 312 includes a first terminal connected to the second input terminal of the operational amplifier 310, and a second terminal connected to the second voltage reference. The resistor 314 includes a first terminal connected to an output, and a second terminal connected to the first terminal of the resistor 312. The resistor 316 includes a first terminal connected to the second input terminal of the operational amplifier 310, and a second terminal. The capacitor 324 includes a first terminal connect to the second terminal of the resistor 316, and a second terminal connected to the output terminal of the operational amplifier 310.

The resistor 318 includes a first terminal connected to the output terminal of the operational amplifier 310, and a second terminal. The resistor 320 includes a first terminal connected to the second terminal of the resistor 318, and a second terminal connected to the second voltage reference. The transistor 334 includes a first current electrode connected to the first voltage reference, a second current electrode connected to the output, and a control electrode connected to the second terminal of the resistor 318. The capacitor 332 includes a first terminal connected to the first current electrode of the transistor 334, and a second terminal connected to the second voltage reference. The capacitor 326 includes a first terminal connected to the second current electrode of the transistor 334, and a second terminal connected to the second voltage reference. The capacitor 328 includes a first terminal connected to the first terminal of the capacitor 326, and a second terminal connected to the second terminal of the capacitor 326. The capacitor 330 includes a first terminal connected to the first terminal of the capacitor 328, and a second terminal connected to the second terminal of the capacitor 328. The resistor 322 includes a first terminal connected to the first terminal of the capacitor 330, and a second terminal connected to the second terminal of the capacitor 330.

The operational amplifier 310 receives the output voltage of the converter circuit 304 at the first input terminal. The second input terminal of the operational amplifier receives a feedback voltage. Based on the voltages received at the first and second input terminals, the operational amplifier 310 outputs a voltage on the output terminal. Based on the resistors 318, 320, and 322 and the capacitors 326, 328, 330, and 332, the transistor 334 can further amplifier the voltage from the operational amplifier 310. Additionally, the resistive value of the resistor 322 and the capacitive value of the capacitors 326, 328, and 330 provide a voltage for the output of the amplification circuit 306.

Figure 4:
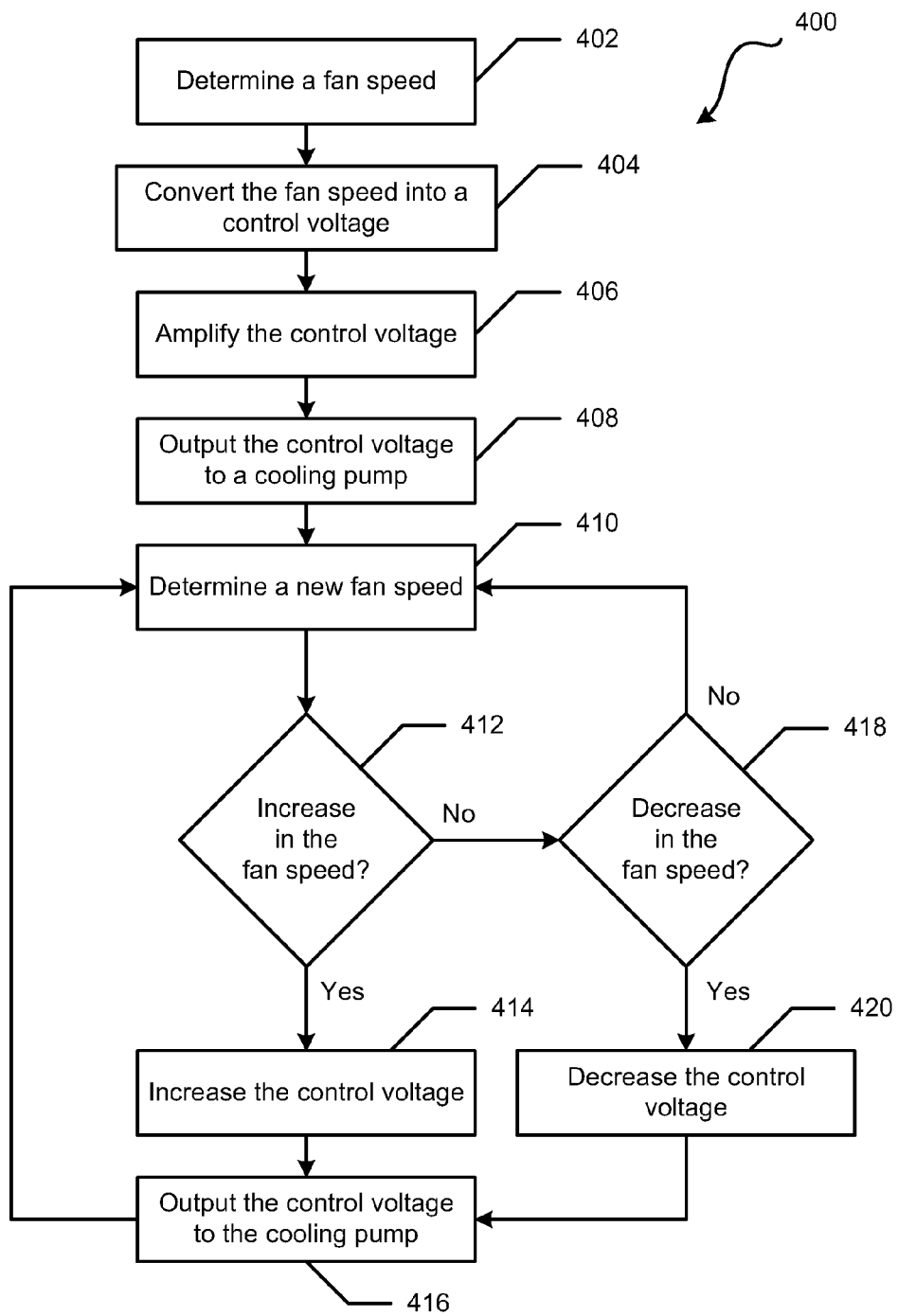
FIG. 4 is a flow diagram of a method for controlling a speed of a cooling pump in a computer liquid cooling system.

FIG. 4 shows a flow diagram of a method 400 for controlling a speed of a cooling pump in an information handling system liquid cooling system. At block 402, a fan speed is determined. The fan speed is converted into a control voltage at block 404. At block 406, the control voltage is amplified. The control voltage is outputted to a cooling pump at block 408. At block 410, a new fan speed is determined. A determination is made whether the fan speed increased at block 412. At block 414, if the fan speed is increased, the control voltage is increased. The control voltage is outputted to the cooling pump at block 416 and the flow diagram continues at block 410. If the fan speed is not increased, a determination is made whether the fan speed is decreased at block 418. If the fan speed is not decreased, then the flow diagram continues as stated above for block 410. If the fan speed is decreased, then the control voltage is decreased at block 420 and the flow diagram continues as stated above at block 416.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A system comprising:
 a fan tachometer module adapted to measure a speed of a cooling fan;
 a conversion module in communication with the fan tachometer module, the conversion module adapted to convert the speed of the cooling fan to a control voltage based on a predetermined ratio between the speed of the cooling fan and a speed of a cooling pump; and
 a pump tachometer module in communication with the conversion module, the pump tachometer module adapted to control the speed of the cooling pump based on the control voltage.

2. The system of claim 1 further comprising:
 an amplification module in communication with the pump tachometer module, the amplification module adapted to amplify the control voltage.

3. The system of claim 1 wherein the pump tachometer module is further adapted to maximize the speed of the cooling pump while minimizing a noise level of the cooling pump.

4. The system of claim 1 wherein the system prevents a customization of a motherboard.

5. The system of claim 1 wherein the speed of the cooling pump is actively controlled.

6. The system of claim 1 wherein an amount noise produced by the cooling pump is maintained below an amount of noise produced by the cooling fan.

7. A method comprising:
 measuring a cooling fan tachometer frequency;
 converting the cooling fan tachometer frequency to a control voltage based on a predetermined ratio between a speed of a cooling fan and a speed of a cooling pump; and
 varying the speed of the cooling pump according to the control voltage.

8. The method of claim 7 further comprising:
 minimizing an amount of noise produced by the cooling pump.

9. The method of claim 8 wherein the amount of noise produced by the cooling pump is maintained below an amount of noise produced by the cooling fan.

10. The method of claim 7 wherein the speed of the cooling pump is actively controlled.

11. The method of claim 7 wherein the predetermined ratio is used to keep an amount of noise produced by the cooling pump below an amount of noise produced by the cooling fan.

12. The method of claim 7 further comprising:
 preventing a customization of a motherboard to adjust the speed of the cooling pump based on the speed of the cooling fan.

13. A method comprising:
 measuring a speed of a cooling fan;
 increasing a control voltage by a predetermined ratio between the speed of the cooling fan and a speed of a cooling pump based on an increase in the speed of the cooling fan; and
 varying the speed of the cooling pump according to the control voltage.

14. The method of claim 13 further comprising:
 decreasing the control voltage by the predetermined ratio between the speed of the cooling fan and the speed of the cooling pump based on a decrease in the speed of the cooling fan; and
 varying the speed of the cooling pump according to the control voltage.

15. The method of claim 13 wherein an amount of noise produced by the cooling pump is maintained below an amount of noise produced by the cooling fan.

16. The method of claim 13 wherein the speed of the cooling pump is actively controlled.

17. The method of claim 13 wherein the predetermined ratio is used to keep an amount of noise produced by the cooling pump below an amount of noise produced by the cooling fan.

18. The method of claim 13 further comprising:
 minimizing an amount of noise produced by the cooling pump.

19. The method of claim 13 further comprising:
 preventing a customization of a motherboard to adjust the speed of the cooling pump based on the speed of the cooling fan.

* * * * *